United States Patent

Rasmusson

[11] Patent Number: 5,978,473
[45] Date of Patent: Nov. 2, 1999

[54] GAUGING CONVERGENCE OF ADAPTIVE FILTERS

[75] Inventor: Jim Agne Jerker Rasmusson, Brosarp, Sweden

[73] Assignee: Ericsson Inc., Research Triangle Park, N.C.

[21] Appl. No.: 08/578,944

[22] Filed: Dec. 27, 1995

[51] Int. Cl.[6] .................................................. H04M 1/19
[52] U.S. Cl. ......................................... 379/406; 379/410
[58] Field of Search .................................. 379/406, 410, 379/409, 411, 407; 364/724.19, 724.16; 370/32.1, 289, 286, 290, 291

[56] References Cited

U.S. PATENT DOCUMENTS

| | | | |
|---|---|---|---|
| 3,787,645 | 1/1974 | Ochiai et al. | 379/410 |
| 4,903,247 | 2/1990 | Van Gerwen et al. | 367/135 |
| 4,918,727 | 4/1990 | Rohrs et al. | 379/410 |
| 4,922,530 | 5/1990 | Kenney et al. | 379/411 |
| 5,007,044 | 4/1991 | Miyoshi et al. | 370/291 |
| 5,027,369 | 6/1991 | Kuenast | 375/233 |
| 5,173,924 | 12/1992 | Hiraiwa et al. | 375/232 |
| 5,263,020 | 11/1993 | Yatsuzuka et al. | 370/289 |
| 5,278,780 | 1/1994 | Eguchi | 364/724.19 |
| 5,303,173 | 4/1994 | Mori et al. | 364/724.19 |
| 5,349,609 | 9/1994 | Tsujimoto | 375/347 |
| 5,535,149 | 7/1996 | Mori et al. | 364/724.19 |

FOREIGN PATENT DOCUMENTS

| | | | |
|---|---|---|---|
| 0596610A2 | 5/1994 | European Pat. Off. | H04B 3/23 |

OTHER PUBLICATIONS

B. Widrow et al., *Adaptive Signal Processing*, Chapter 1: "Adaptive Systems", pp. 3–14.
B. Widrow et al., *Adaptive Signal Processing*, Chapter 2: "The Adaptive Linear Combiner", pp. 15–26.

*Primary Examiner*—Scott Weaver
*Attorney, Agent, or Firm*—Burns, Doane, Swecker & Mathis, L.L.P.

[57] ABSTRACT

A measure of a degree of convergence in an adaptive filter arrangement is derived from the comparison of an amount of adaptation occurring in the adaptive filter arrangement, over a predetermined period of time, with a normalizing value accumulated for the same period. Supplemental signal processing may be invoked, modified or withdrawn based upon the degree of convergence indicated.

27 Claims, 5 Drawing Sheets

GAUGING CONVERGENCE OF ADAPTIVE FILTERS

BACKGROUND

The present invention relates generally to adaptive filters, and more particularly to a technique for gauging the convergence of an adaptive filter arrangement capable of canceling echo signals.

In the field of telecommunications, such as with speakerphones and in cellular telephony, it is often desirable to allow a user to operate communication equipment, without requiring the continued occupation of one or more of the user's hands. This can be an important factor in environments, such as automobiles, where a driver's preoccupation with holding telephone equipment may jeopardize not only his or her safety, but also the safety of others who share the road.

To accommodate these important needs, so-called "hands-free" telephone equipment has been developed, in which various telephone components are mounted within the hands-free environment, thereby obviating the need to hold them. For example, in an automobile application, a cellular telephone's microphone might be mounted on the sun visor, while the loudspeaker may be a dash-mounted unit, or may be one that is associated with the car's stereo equipment. With components mounted in this fashion, a cellular phone user may carry on a conversation without having to hold the cellular unit or its handset.

One problem with a hands-free arrangement is that the microphone tends to pick up sound from the cellular telephone's remote loudspeaker, in addition to the voice of the cellular telephone user. Because of delays introduced by the communications system as a whole, the sound from the loudspeaker may be heard by the individual on the other end of the call (the so-called "far end") as an echo of his or her own voice. Such an echo degrades audio quality and its mitigation is desirable. Solutions for ameliorating the echo include utilizing an adaptive echo cancellation filter or an echo attenuator.

An exemplary "hands-free" mobile telephone, having a conventional echo canceler, in the form of an adaptive filter arrangement, is depicted in FIG. 1. A hands-free communications environment may be, for example, an automotive interior in which the mobile telephone is installed. Such an environment can cause effects on an acoustic signal propagating therein, which effects are typically unknown. Henceforth, this type of environment will be referred to throughout this specification as an unknown system H(z). The microphone 105 is intended for detecting a user's voice, but may also have the undesired effect of detecting audio signals emanating from the loudspeaker 109. It is this undesired action that introduces the echo signal into the system. An echo cancellation circuit 100 can be provided that cancels the echo component contained in a signal generated by a microphone 105. The echo cancellation circuit 100 can be implemented in a digital signal processor (DSP). A signal 120, received by the microphone 105, is amplified by amplifier 122 and converted to a digital format by analog-to-digital (A/D) converter 124. The digitized microphone signal 126 is provided to the echo cancellation circuit 100 for echo processing and eventual transmission by the transceiver 110. An input signal 112, received by the transceiver 110, is converted to a digital format by an A/D converter 132, and the digitized input signal 134 is then provided to the echo cancellation circuit 100. The digitized input signal 134 is sampled within the echo cancellation circuit 100 by a least mean square (LMS) cross correlator 103 and an adaptive finite impulse response (FIR) filter 101. The digitized input signal 134 is then output from the echo cancellation circuit 100 to a digital-to-analog (D/A) converter 136 and then to an amplifier 138, before being provided to a loudspeaker 109. An output signal 130, generated by the echo cancellation circuit 100, is provided to the transceiver 110 following digital-to-analog conversion by D/A converter 132. The transceiver 110 communicates with a base station (not shown).

In operation, the adaptive finite impulse response (FIR) filter 101 generates an echo estimate signal 102, which is commonly referred to as a û signal. The echo estimate signal 102 is the convolution of the digitized input signal 134, and a sequence of m filter weighting coefficients ($h_i$) of the filter 101 (See Equation 1).

$$\hat{u}(n) = \sum_{i=0}^{m-1} h_i x(n-i) \quad \text{Equation 1}$$

where
x(n) is the input signal,
m is the number of weighting coefficients, and
n is the sample number.

When the weighting coefficients are set correctly, the filter 101 produces an impulse response that is approximately equal to the response produced by the loudspeaker 109 within the unknown system H(z). The echo estimate signal 102 generated by the filter 101, is subtracted from the incoming digitized microphone signal 126 (designated u(n) in Equation 2), to produce an error signal e(n) 107 (see Equation 2).

$$e(n) = u(n) - \hat{u}(n) \quad \text{Equation 2}$$

Ideally, any echo response from the unknown system H(z), introduced by the loudspeaker 109, is removed from the digitized microphone signal 126 by the subtraction of the echo estimate signal 102. Typically, 200 to 400 weighting coefficients (henceforth referred to as "coefficients") are required for effectively canceling an echo in a typical hands-free environment.

It can be seen that the effectiveness of the echo canceler is directly related to how well the filter 101 is able to replicate the impulse response of the unknown system H(z). This, in turn, is directly related to the set of coefficients, $h_i$, maintained by the filter 101.

It is advantageous to provide a mechanism for dynamically altering the coefficients, $h_i$, to allow the filter 101 to adapt to changes in the unknown system H(z). In a car having a hands-free cellular arrangement, such changes may occur when a window or car door is opened or closed. A well-known coefficient adaptation scheme is the Least Mean Square (LMS) process, which was first introduced by Widrow and Hoff in 1960, and is frequently used because of its efficiency and robust behavior. As applied to the echo cancellation problem, the LMS process is a stochastic gradient step method which uses a rough (noisy) estimate of the gradient, $g(n)=e(n)\underline{x}(n)$, to make an incremental step toward minimizing the energy of an echo signal in a microphone signal, e(n), where $\underline{x}(n)$ is in vector notation corresponding to an expression $\underline{x}(n)=[x(n) \ x(n-1) \ x(n-2) \ldots x(n-m+1)]$. The update information produced by the LMS process e(n) $\underline{x}(n)$ is used to determine the value of a coefficient in a next sample. The expression for calculating a next coefficient value $h_i(n+1)$ is given by:

$$h_i(n+1)=h_i(n)+\mu e(n)x(n-i),\ i=0\ \ldots\ m-1 \quad \text{Equation 3}$$

where x(n) is the digitized input signal 134, ($h_i$) is a filter weighting coefficient, i designates a particular coefficient, m is the number of coefficients, n is the sample number, and $\mu$ is a step or update gain parameter.

The LMS method produces information in incremental portions each of which portions may have a positive or a negative value. The information produced by the LMS process can be provided to a filter to update the filter's coefficients.

Referring back to FIG. 1, the conventional echo cancellation circuit 100 includes an LMS cross correlator 103 for providing coefficient update information 104 to the filter 101. In this arrangement, the LMS cross correlator 103 monitors the corrected signal 107 that represents the digitized microphone signal 126 minus the echo estimate signal 102 generated by the filter 101. The echo estimate signal 102 is generated, as described above, with the use of update information 104 provided to the filter 101 by the LMS cross correlator 103. The coefficients, $h_i$, of the filter 101, accumulate the update information 104 as shown by Equation 3.

In the conventional echo canceler circuit depicted in FIG. 1, a noticeable amount of time may be required before the FIR filter's coefficients have been sufficiently adjusted to provide a reasonable approximation of the impulse response of the unknown system H(z). Once the echo canceler circuit has adjusted sufficiently to provide a reasonable approximation of the impulse response of the unknown system, the system is said to have "converged." Before and during adaptation (i.e., prior to convergence), the filter 101 generally does not perform as well as when it is converged. For example, in the depicted echo cancellation arrangement, a residual echo may still be heard at the far-end while the system undergoes adaptation. Therefore, during adaptation it may be desirable to provide supplemental processing (e.g., echo suppression), in order to suppress the echo during this adaptation interval. This may simply involve attenuating the microphone signal, which not only reduces the echo component, but also has the detrimental effect of diminishing the desired speech signal from a user in the hands-free environment. Hence, it is desirable to know when adaptation has completed, that is, when the filter 101 has converged, in order to determine when to disengage the supplemental echo suppression processing.

SUMMARY

It is an object of the present invention to provide methods and apparatus for determining when an adaptive filter arrangement has converged.

It is still another object to provide supplemental signal processing, which signal processing is modified, invoked, or withdrawn, based on an indication of convergence.

It is a further object to provide an indication of a degree of convergence which can be used to modify an adaptation process.

A system in accordance with the invention involves methods and apparatus for gauging convergence of a filter arrangement having an adaptation process. Determination of convergence in accordance with an exemplary embodiment of this invention includes comparing an amount of adaptation within the filter arrangement occurring over a predetermined period of time (convergence determination period) with an accumulated baseline value for the same period. The result of the comparison provides a normalized convergence value representing the state of convergence of the filter arrangement. In accordance with another aspect of the invention, the convergence value can be used to invoke or withdraw supplemental signal processing. Alternatively, the state of convergence can be used to adjust an adaptation process.

An exemplary embodiment of the invention merges a convergence gauge with an adaptive filter arrangement. In such an embodiment, the arrangement includes a first (or main) filter and a second (or "delta") filter. Coefficients of the second filter are repeatedly updated over a convergence determination period by an adaptation process. At the end of the convergence determination period, the coefficients of the second filter are sent to a convergence determination device. The convergence determination device determines the amount of adaptation for the period, represented by the state of the second filter's coefficients at the end of the convergence determination period. The convergence determination can involve a comparison of the coefficients of the second filter and an accumulated baseline value corresponding to a system input signal supplied over the same period.

The convergence determination result indicates a degree to which the filter arrangement has adapted, or converged, over the particular convergence determination period. If the indication is favorable (i.e., the arrangement has moved closer to converging), the second filter's coefficients are supplied to the first filter for updating of its coefficients, after which the second filter's coefficients are reset to begin accumulating adaptation information for a next convergence determination period.

In an alternative arrangement, a memory device may replace the second filter (the delta filter). In this embodiment, the single filter's coefficients are repeatedly updated over a convergence determination period by an adaptation process. Over the same period, the memory accumulates the information updates from the adaptation process. At the end of the convergence determination period, the accrued adaptation information is sent to a convergence determination block for determination of a convergence state. This determination can involve a comparison with a baseline value corresponding to the signal input to the system over the convergence determination period to provide a normalized convergence value. The memory is cleared after each convergence determination.

A method, in accordance with an exemplary embodiment of the invention, for determining a degree of convergence in an adaptive filter arrangement, includes evaluating an accumulated value corresponding to an amount of adaptation occurring over a convergence determination period. The method can also include comparison with an accumulated value corresponding to the sum of system input signals accumulated over the convergence determination period to provide a normalized convergence value.

In another aspect of the invention, a convergence state is checked repeatedly during the convergence determination period. Doing so allows for output of a more desirable signal for a particular sample in the event that the arrangement diverges for the particular sample. Intermediate checking may also provide for adjustment of the adaptation process between convergence determinations performed at the conclusion of the convergence determination period.

Being able to determine a state of convergence of an adaptive filter arrangement can provide decision points where supplemental signal processing can be invoked. Furthermore, by determining the state of convergence, it is possible to optimally control the filter arrangement by providing adjustments at different stages of adaptation. For example, early in an adaptation process, it may be advantageous to adapt the system as quickly as possible (e.g., by using high update gain μ—see Equation 3), whereas following convergence, system performance may be improved by fine tuning the filter arrangement (e.g., by reducing the update gain μ).

BRIEF DESCRIPTION OF THE DRAWINGS

The foregoing, and other objects, features and advantages of the present invention will be more readily understood upon reading the following detailed description in conjunction with the drawings in which.

DETAILED DESCRIPTION

The following detailed description is given with respect to an echo cancellation arrangement provided in a hands-free communications environment in which a microphone and loudspeaker are used. It should be noted that the context of an echo cancellation arrangement is merely illustrative and should not be construed as a required application of the invention. The invention can be applied in any system involving an adaptive filter arrangement, wherein filter coefficients are adaptively modified in order to model a system response and to generate an appropriate filtered output signal and/or to effectuate the convergence of the filter arrangement.

Figure 1:
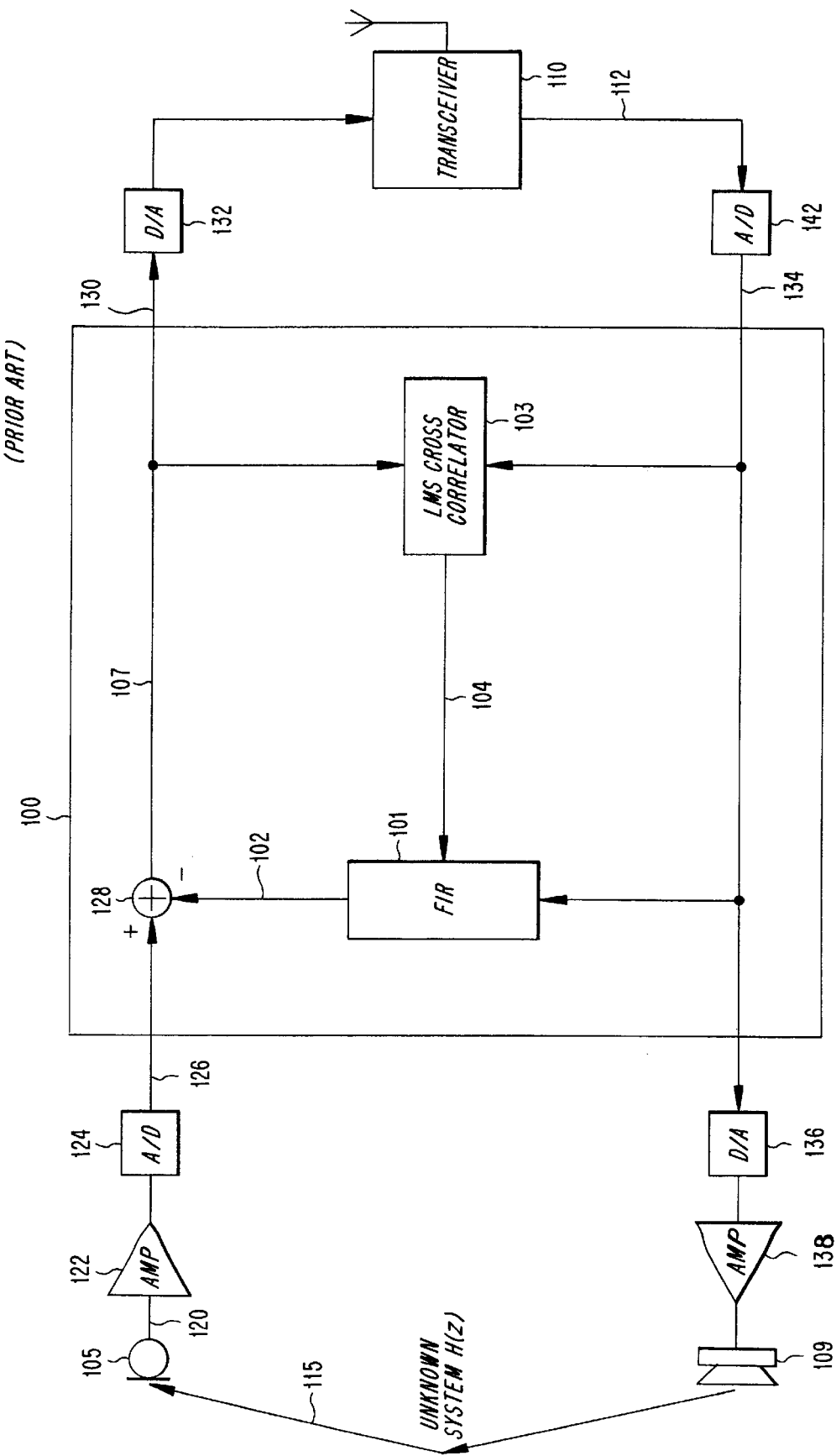
FIG. 1 depicts a block diagram of a hands-free arrangement having a conventional echo cancelling system.
Figure 2:
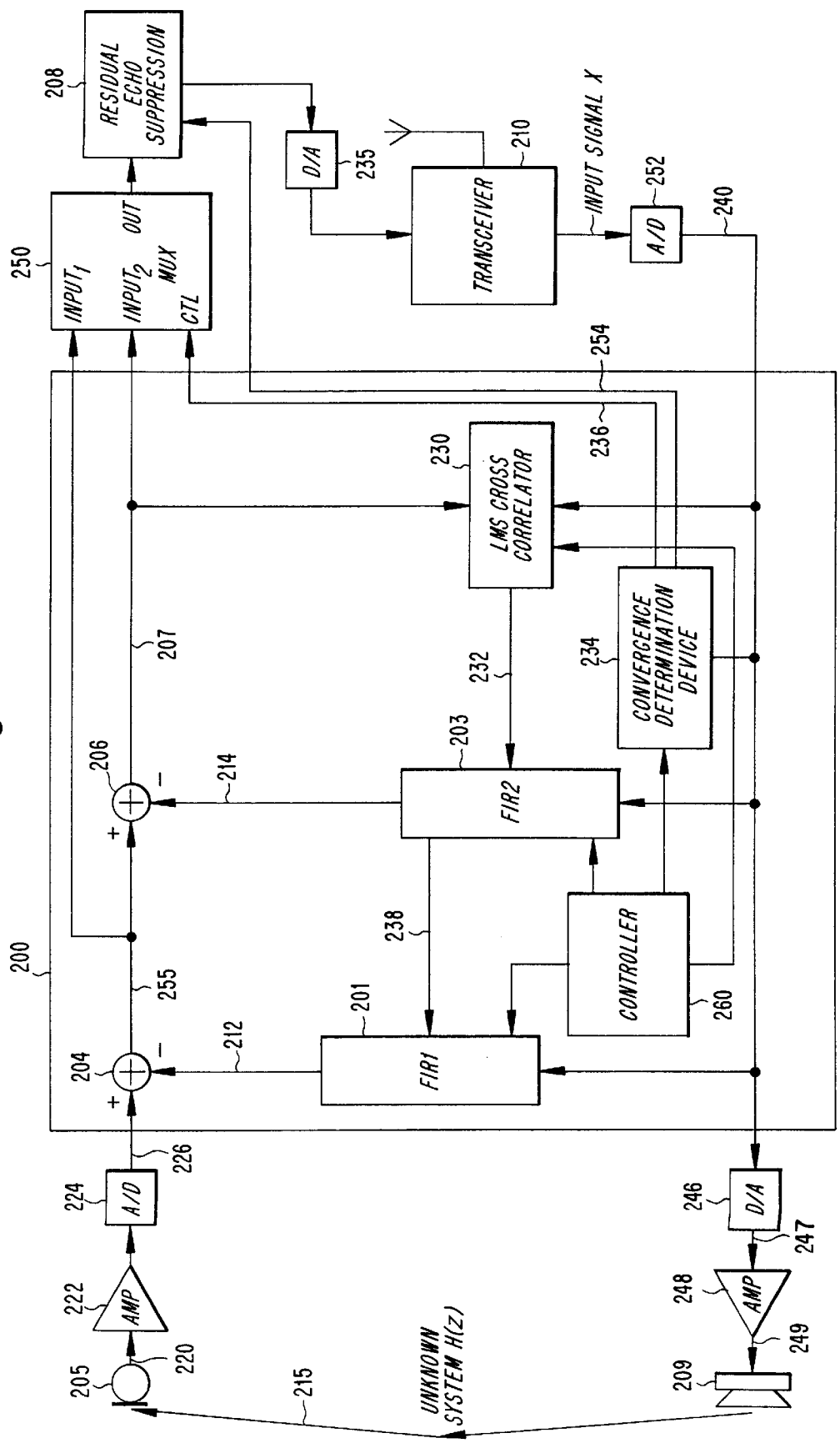
FIG. 2 depicts an echo cancelling system in accordance with a first embodiment of the present invention.

An arrangement conforming to a first embodiment of the invention, as applied to the aforementioned echo cancellation system, is shown in FIG. 2. In the depicted arrangement, an input signal x, generated by the transceiver 210, is converted to a digital format by an A/D converter 252. The digitized input signal 240 provided to an echo cancellation circuit 200 wherein it is sampled by each of a LMS cross correlator 230, a convergence determination device 234, a second finite impulse response filter 203 (FIR2), and a first finite response filter 201 (FIR1). The digitized input signal 240 is then converted back into analog form by a D/A converter 246, amplified by an amplifier 248 and then output to a loudspeaker 209. The unknown system H(z) receives an acoustic input signal from the loudspeaker 209. Microphone 205 samples audio signals from the unknown system H(z) to generate a microphone signal 220. The microphone signal 220 typically is amplified by an amplifier 222 and then converted to a digital format by an A/D converter 224 to produce a digitized microphone signal 226. Audio signals from the unknown system H(z) (i.e., digitized microphone signal 226) may contain both a desired signal (e.g., the voice of a user) and the audio signal from the loudspeaker 209. The loudspeaker audio signal can be picked up by the microphone 205 and perceived by a far-end user as an echo of his or her own voice.

In the exemplary embodiment of the invention depicted in FIG. 2, the echo cancellation circuit 200 is provided to remove an echo signal introduced by loudspeaker 209. Echo cancellation circuit 200 can be provided in the form of a digital signal processor or as an arrangement of echo cancelling components and a convergence determination device contained on a single chip. In the exemplary embodiment, the first and second filters 201, 203 are finite impulse response (FIR) filters. However, an arrangement in accordance with the invention may alternatively include digital infinite impulse response (IIR) filters, or any other filter type that has coefficients which can be adaptively modified.

The first filter 201 outputs a first echo estimate signal 212 which is subtracted from the digitized microphone signal 226 at a first summation point 204 to produce a first error signal 255. The first error signal 255 is supplied to an input of a second summation point 206, where a second echo estimate signal 214, supplied by the second filter 203, is subtracted to produce a second error signal 207.

In order to adaptively modify coefficients of the first and second filters 201, 203, an LMS cross correlator 230 samples both the second error signal 207 and the digitized input signal 240. An update information signal 232 is generated by the LMS cross correlator 230 that is supplied to update the coefficients of the second filter 203.

The coefficients of the second filter 203 are periodically updated by the LMS cross correlator 230. After a longer period, the coefficients of the first filter 201 are updated with coefficients from the second filter 203, after which the coefficients of the second filter 203 are reset. Updating the coefficients of the first filter 201 can be performed by adding the coefficients of the second filter 203 to the coefficients of the first filter 201. This is represented by the following equation:

$$h_{i,1} = h_{i,1} + h_{i,2}, \ i = 0 \ldots m-1 \qquad \text{Equation 4}$$

where $h_{i,1}$ and $h_{i,2}$ are the i-th coefficients of the first and second filters, 201 and 203, respectively, and m is the number of coefficients for each of the first and second filters 201, 203.

After this update, the coefficients of the second filter 203 are set to zero (see Equation 5) in a preferred embodiment, thereby allowing the second filter to resume accumulation of LMS updates in a next period.

$$h_{i,2} = 0, \ i = 0 \ldots m-1 \qquad \text{Equation 5}$$

The filter arrangement's response capability is maintained, in part, by virtue of the resetting operation. That is, the second filter's 203 coefficients, once reset, are receptive to additional updates 232 from the LMS cross correlator 230 with less risk of overflow. Moreover, upon updating the first filter's coefficients and resetting those of the second filter 203, the filtering capability that was provided by the combined efforts of the first and second filters 201, 203 is performed entirely by the first filter 201, so the quality of the filter performance also is maintained.

A convergence determination device 234 generates convergence indicator signals 236 and 254 based on coefficients received from the second filter 203 and samples of a baseline input signal in the form of the digitized input signal 240. In the exemplary application of the invention, the convergence indicator signals 236 and 254 are provided to a multiplexor (MUX) 250 and a residual echo suppression device 208, respectively. The convergence indicator signal 236 is supplied to the control port (CTL) of the MUX 250. Depending on a value input to its control port, the MUX 250 provides either the first error signal 255 (input$_1$) or the second error signal 207 (input$_2$) for output to the residual echo suppression device 208. Invocation of the residual echo suppression device 208 is controlled by the convergence indicator signal 254. Residual echo suppression can be gradually introduced or withdrawn based on the degree of convergence indicated by the convergence indicator signal 254. Residual echo suppression is typically invoked during initial stages of operation while the filters adapt to the echo response. During stable operation, the residual echo suppression device 208 is controlled so that it will pass the signal from its input to its output unchanged. The signal output from the residual echo suppression device 208 is then converted by D/A converter 235 into analog form, and then provided to the transceiver 210.

A controller 260 controls the operation of the echo cancellation circuit 200. The controller 260 can be in the form of on-board circuitry (depicted), off-board control, or control by software. In any of these alternatives, the exemplary controller 260 operates the echo cancellation circuit 200 by administering the transfer of information, timing, convergence calculation, and I/O functions as described in this specification. Those having ordinary skill in the art will have no trouble in making and using a suitable controller 260 based on the description presented here.

Figure 4:
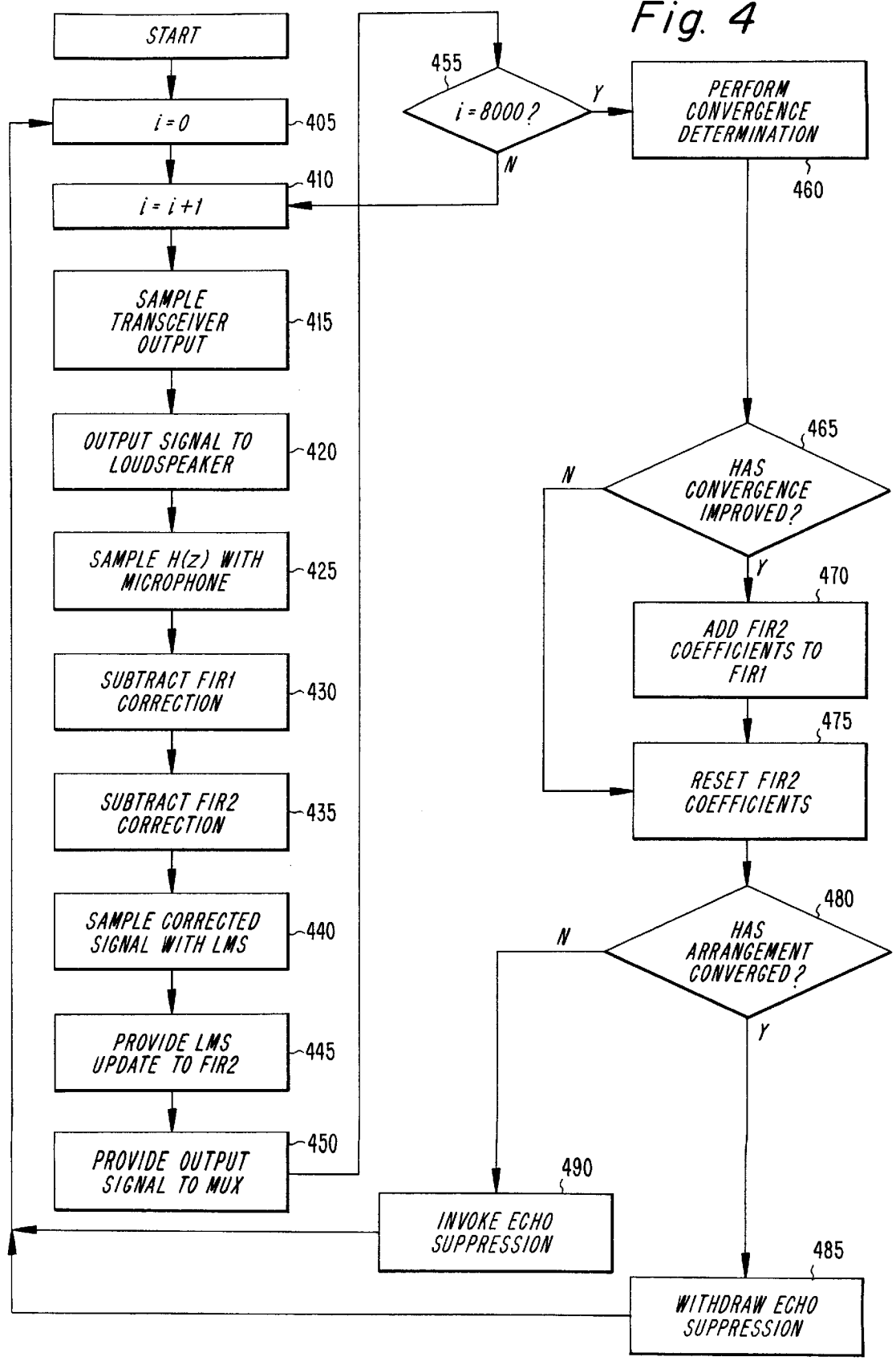
FIG. 4 is a flowchart showing a process in accordance with an embodiment of the present invention.

A process of operating the apparatus of FIG. 2 in accordance with the invention is illustrated by the flowchart of FIG. 4. Control signals for operating the apparatus as described below are generally provided by the controller 260. In the exemplary embodiment described below, a convergence determination is made once per second. A one second convergence determination period consists of 8000 sample cycles. A sampling rate for the echo cancellation circuit 200 is 8000 samples per second. For each of sample cycles 1 through 8000, activities corresponding to flowchart blocks 410 through 455 occur, including updating of the coefficients of the second filter 203. During the last sample cycle of the convergence determination period (e.g., after the 8000th sample cycle is completed) the steps corresponding to flowchart blocks 460 through 490 can occur.

A new determination period begins at block 405 by resetting a sample cycle counter, i, to zero. For each sample cycle, the sample number counter i is incremented by one (block 410). The digitized input signal 240 is sampled (block 415) by each of the LMS cross correlator 230, the convergence determination device 234, the second filter 203, and the first filter 201. The digitized input signal 240 is then converted back to analog by D/A converter 246, amplified by the amplifier 248 and supplied to the loudspeaker 209 (block 420) for generation of an audio signal into the unknown system H(z).

The microphone 205 samples the unknown system H(z) (at block 425). The signal is appropriately amplified and converted to produce digitized microphone signal 226. At block 430, the first echo estimate signal 212 is subtracted from the digitized microphone signal 226 to produce the first error signal 255. At block 435, the second echo estimate signal 214 is subtracted from the first error signal 255 to produce the second error signal 207. The second error signal 207 is sampled by the LMS cross correlator 230 at block 440. At block 445, the LMS cross correlator 230 supplies information 232 to the second filter 203 for updating the second filter's 203 coefficients. Concurrent with the sampling by the LMS cross correlator 230, the second error signal 207 is supplied to the MUX 250 for output purposes (block 450).

Following each sample cycle, the sample cycle counter, i, is checked (block 455) to see if the sampling period is complete (i.e., whether 8000 samples cycles have been performed). If 8000 sample cycles have not been completed, the sampling process continues at block 410 by incrementing the counter i. However, if 8000 samples cycles have been performed (i.e., i=8000), determination of a degree of convergence is made (block 460). Techniques for making this determination are described in greater detail below.

If the convergence degree has improved over a last determination (decision block 465) the coefficients of the second filter 203 are added to the coefficients of the first filter 201 (block 470) after which the coefficients of the second filter 203 are reset (block 475). If the convergence degree has not improved at decision block 465, the coefficients of the second filter 203 are reset without updating the coefficients of the first filter 201.

A convergence state is next examined to determine whether the arrangement has converged (decision block 480). If convergence is not indicated, or the degree of convergence merits it, residual echo suppression may be invoked or increased (block 490). If convergence is indicated, or the degree of convergence merits, residual echo suppression may be withdrawn or reduced (block 485). In either case, a new period begins at block 405.

Another exemplary embodiment in accordance with the invention can be provided to output the better of the first error signal 255 or the second error signal 207 in situations where the LMS process erroneously provides update information that causes the arrangement to diverge slightly. One scenario where this may occur is in a so-called "double talk" situation wherein both parties in a conversation speak simultaneously. In this case, the LMS cross correlation may produce temporary artifacts (errors) in the cross correlation process, which result in LMS update information that would cause the arrangement to diverge for the sample rather than converge. This may especially be a problem if the two parties have similar voices. Artifacts may cause adaptation to diverge slightly toward an erroneous correlation setting for the particular sample. Divergence of adaptation can be detected using a double talk detector, or by performing an intermediate convergence check, or checks, during the convergence determination period.

Referring back to FIG. 2, in the event of a double talk situation, or other erroneous cross correlation, it may be beneficial to choose the first error signal 255, rather than the second error signal 207 for output to the transceiver 210, for a sample cycle in which update information would cause the filter operation to diverge. The LMS output 232, reflecting slight divergence due to, for example, the double talk situation, means that the coefficients of the second filter 203 worsen rather than improve the convergence state. Consequently, the second echo estimate signal 214, subtracted from the first error signal 255, results in the second error signal 207 being less effective than the first error signal 255 in cancelling an echo. Hence, it may be desirable to output the first error signal 255 in such situations.

Figure 5:
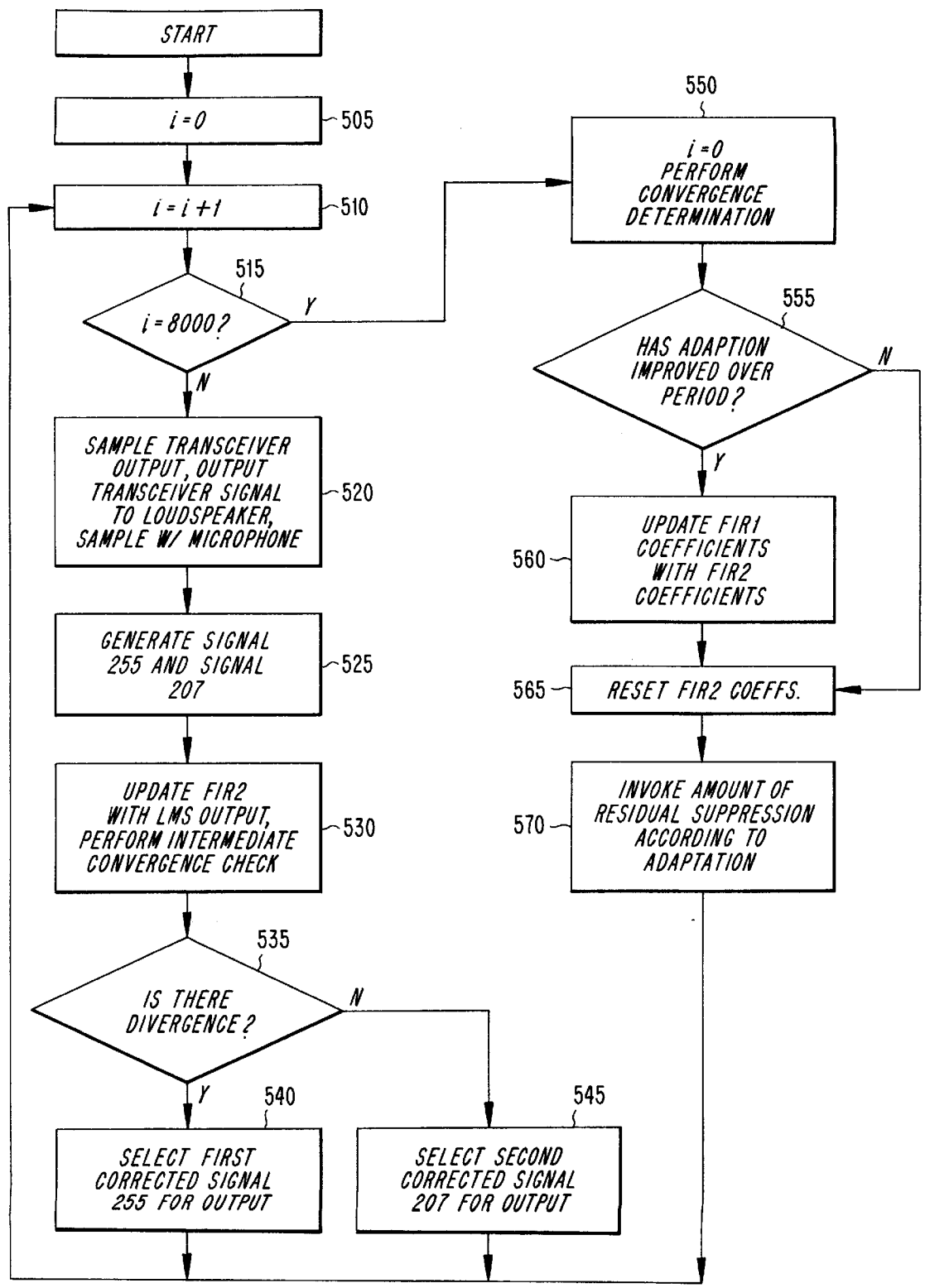
FIG. 5 is a flowchart showing a process in accordance with another embodiment of the present invention.

A method in accordance with one aspect of the invention for remedying a situation wherein conditions such as double talk cause adaptation to diverge for some portion of a sample period is illustrated in the flow diagram in FIG. 5. The process depicted in FIG. 5 is not unlike that depicted in FIG. 4; however, divergence is checked every sample cycle in order to make a determination as to whether it would be advantageous to output the first error signal 255 rather than the second error signal 207. It will be appreciated that the divergence check can be made less frequently in order to spot check for divergent samples.

Referring to FIG. 5, a new determination period begins at block 505 by resetting a sample cycle counter, i, to zero. For each sample cycle, the sample number counter, i, is incremented by one (block 510). In accordance with an exemplary embodiment, the sample cycle counter, i, is checked at decision block 515 to see if 8,000 sample cycles have been performed. If 8,000 sample cycles have not been completed, then the digitized input signal 240 is sampled by the cross correlator 230, the second filter 203 and the first filter 201. The digitized input signal is then converted back into analog form, amplified and output to the loudspeaker 209. The acoustic signal generated by the loudspeaker 240 is then sampled by the microphone 205 in a manner like that described with respect to FIG. 4.

First and second echo estimate signals 212 and 214 are generated and output by the first and second filters 201 and 203, respectively (at block 525). From these, the first and second error signals 255 and 207 are generated as previously described. At block 530, the second filter 203 is updated with LMS output 232, and convergence determination device 234 performs an intermediate check.

A determination of whether adaptation has diverged is made at decision block 535. If divergence is not indicated, convergence determination device 234 outputs a control signal 236 to MUX 250 to input$_2$, in order to select the second error signal 207 for output to the residual echo suppression unit 208. If divergence is detected, then first error signal 255 is selected by convergence determination device 234 for output from the MUX 250. The sample cycle then advances to a next sample, and counter, i, is incremented accordingly (block 510).

If it is determined at decision block 515 that the sample cycle counter i is equal to 8,000, convergence determination for the convergence determination period is made at block 550. The convergence determination is performed in a manner consistent with that described for the process illustrated by the flowchart in FIG. 4. However, in accordance with yet another aspect of the invention, residual echo suppression can be invoked in an amount corresponding to the amount of adaptation occurring over a given convergence determination period (block 570). For example, the residual echo suppression device 208 can be controlled to provide a gradually lower amount of residual echo suppression as the filter arrangement converges. In accordance with such an embodiment, a convergence value can be compared with predetermined threshold values in order to gradually invoke residual echo suppression in appropriate step sizes. Alternatively, the convergence value can be used to provide an amount of residual echo suppression that varies in continuous correspondence with the convergence value.

In an alternative scheme, a double talk detection system (not shown) can be used wherein an indication of an occurrence of double talk can result in the first error signal 255 being selected for output rather than the second error signal 207. Detection of double talk also can be used to preclude updating the second filter 203 with LMS update information. The frequency of double talk occurrence over a given convergence determination period can be monitored and used to control the transfer of coefficient information from the second filter 203 to the first filter 201. If there is a limited amount of double talk during a convergence determination period, the coefficients of the second filter 203 may be transferred intact, or in a slightly scaled form (e.g., multiply the value of the second filter's coefficients by a scaling factor). Such a scaling factor can be adjusted appropriately depending on an amount of double talk indicated for a given convergence determination period. For example, an indication of an excessive amount of double talk can result in a significant reduction in the value of the transferred coefficients or in the scrapping of the coefficient transfer altogether.

It will be appreciated that selecting a higher update gain parameter, $\mu$, results in a faster adaptation. However, it can also result in a greater divergence in the event of a cross correlation artifact. Consequently, it can be advantageous to provide an intermediate convergence check, as discussed above, in order to disregard correlation update information derived for a sample which causes divergence. So for applications where double talk may be more prevalent, it may be desirable to provide an appropriate detector or an intermediate divergence check.

In preferred embodiments, the convergence determination of blocks 460, 530 or 550 is performed for each predetermined time interval by dividing an energy, level, or power value (henceforth referred to generically as "ELP value") of the coefficients of the second filter 203, by an accumulated ELP value of the digitized input signal 240. The coefficient values represent an accumulation of adaptation adjustments for a given period. This is due to the fact that the coefficients, having received updates over the period, represent an average amount of adaptation provided by the LMS cross correlator 230. Each individual LMS information update signal 232 provided per sample cycle is a small incremental value. This value may be positive or negative. Hence, the coefficients represent the sum of all the LMS updates for a given period and, in effect, provide the average value of adaptation for the period.

When convergence determination is performed to produce a convergence value indicating the degree of convergence, the amount of adaptation is normalized by the baseline value given by the digitized input signal 240 accumulated for the period. Normalization in this manner allows for a relative convergence assessment to be made for a given period. For example, when there is little activity (e.g., talking between the users) for a particular period, the digitized input signal 240 and the converted digitized microphone signal 226 may be relatively small. Consequently, the small amount of corresponding adaptation activity in the circuit results in low ELP for the coefficients of the second filter. This low ELP value is normalized by the low ELP value of the digitized input signal 240 so that the convergence value produced by the convergence determination device 234 will not falsely indicate the convergence state of the arrangement.

Calculation of the energy of the coefficients is given by Equation 6:

$$\text{Energy of coefficients} = \sum_{i=0}^{m-1} h_i^2 \qquad \text{Equation 6}$$

where:
m is the number of coefficients in each of the first and second filters 201, 203.
Calculation of the level of the coefficients is given by:

$$\text{Level of coeffecients} = \sum_{i=0}^{m-1} |h_i|. \qquad \text{Equation 7}$$

Calculation of the power of the coefficients is given by dividing the energy value by the number of coefficients.

The accumulated values, for a period, representing the energy, power, or level of the digitized input signal 240 may be calculated as:

$$\text{Energy of digitized input signal } 240 = \sum_{j=0}^{k-1} (x(j))^2 \quad \text{Equation 8}$$

where:

x(j) is the jth digitized input signal, and k is the number of samples in the period.

$$\text{The level of the digitized input signal } 240 = \sum_{j=0}^{k-1} |x(j)|. \quad \text{Equation 9}$$

Calculation of the power of the digitized input signal 240 is performed by dividing the energy value of the digitized input signal 240 by the number of samples in the period.

In an alternative embodiment, accumulated values of the digitized input signal may be calculated as a sliding average. This approach may be desirable because it is less complex to implement.

In the event that the available processing hardware does not provide for efficient calculation of a full precision ELP value as described above, then the coefficient and digitized input signal values may be scaled, either linearly or logarithmically, prior to their use in a computation. For example where the processing hardware is most efficient at computing values that do not exceed 16 bits in length, the coefficient and digitized input signal values may be scaled down (e.g., via truncation or rounding), so that the corresponding computed ELP value will be guaranteed to be representable within 16 bits.

A suitable convergence value can provided by comparing any type of ELP value (i.e., energy, level, or power) for the coefficients of the second filter 203 by any type of ELP value accumulated for the digitized input signal 240 as long as the selected types are consistent between convergence determination periods. Hence, a coefficient power value may be divided by an input signal energy value to determine a convergence value, as long as the convergence value is consistently determined in this manner.

It should be noted that the convergence value should be calculated only when the digitized input signal 240 ELP accumulation for a determination period is ample (i.e., the input accumulation is greater than zero). If the input signal value accumulated for a convergence determination period is zero, or close to zero, no adaptation is possible. In this case, the convergence can not be gauged, so the previous MUX output selection and residual echo suppression amount should be left unchanged.

In accordance with another aspect of the invention, the convergence value can be used to control the application of supplemental signal processing, such as residual echo suppression. The convergence value also can be used to control parameters of adaptation (e.g., the update gain $\mu$). A low convergence value can indicate that the filter has, or is close to converging. A higher value may indicate that more adaptation or supplemental processing is required.

In the arrangement depicted in FIG. 2, the output 236 from the convergence determination device 234 may be used to control the MUX 250 to selectively output either the first error signal 255 or the second error signal 207 to the residual echo suppression device 208 for supplemental echo processing. Normally, the second error signal 207 is slightly better than the first error signal 255 because of the further subtraction of echo estimate signal 214. However, the coefficients of the second filter 203 can occasionally be updated over a convergence determination period using update information 232 that results in a poorer convergence state for that period than in a preceding period. When this happens, it is advantageous to discard the coefficients (i.e., reset them), without transferring them to the first filter 201 (see decision block 465 of FIG. 4), and then use the first error signal 255 for output purposes as described above with respect to FIG. 5.

In operation, the second filter 203, in effect, acts as a memory for storing the update information 232 from the LMS cross correlator 230 during the convergence determination period. Having accumulated the information over the convergence determination period, the coefficients of the second filter 203, in effect, contain the average value of an amount of adaptation for the convergence determination period. This is due to the iterative nature of the incremental update information 232 from the LMS cross correlator 230 that represents an attempt to minimize the echo signal component energy in the second error signal 207. After the coefficient values are provided to the convergence determination device 234, they are combined with coefficients in the first filter 201 so that coefficients of the first filter 201 represent the accumulated adaptation that has occurred so far. The first filter 201, having updated its coefficients thereafter removes the echo component previously eliminated by the second echo estimate signal 214 in addition to the echo component previously eliminated by the first echo estimate signal 212. In order to avoid duplication of this effort, coefficients in the second filter 203 are reset.

Figure 3:
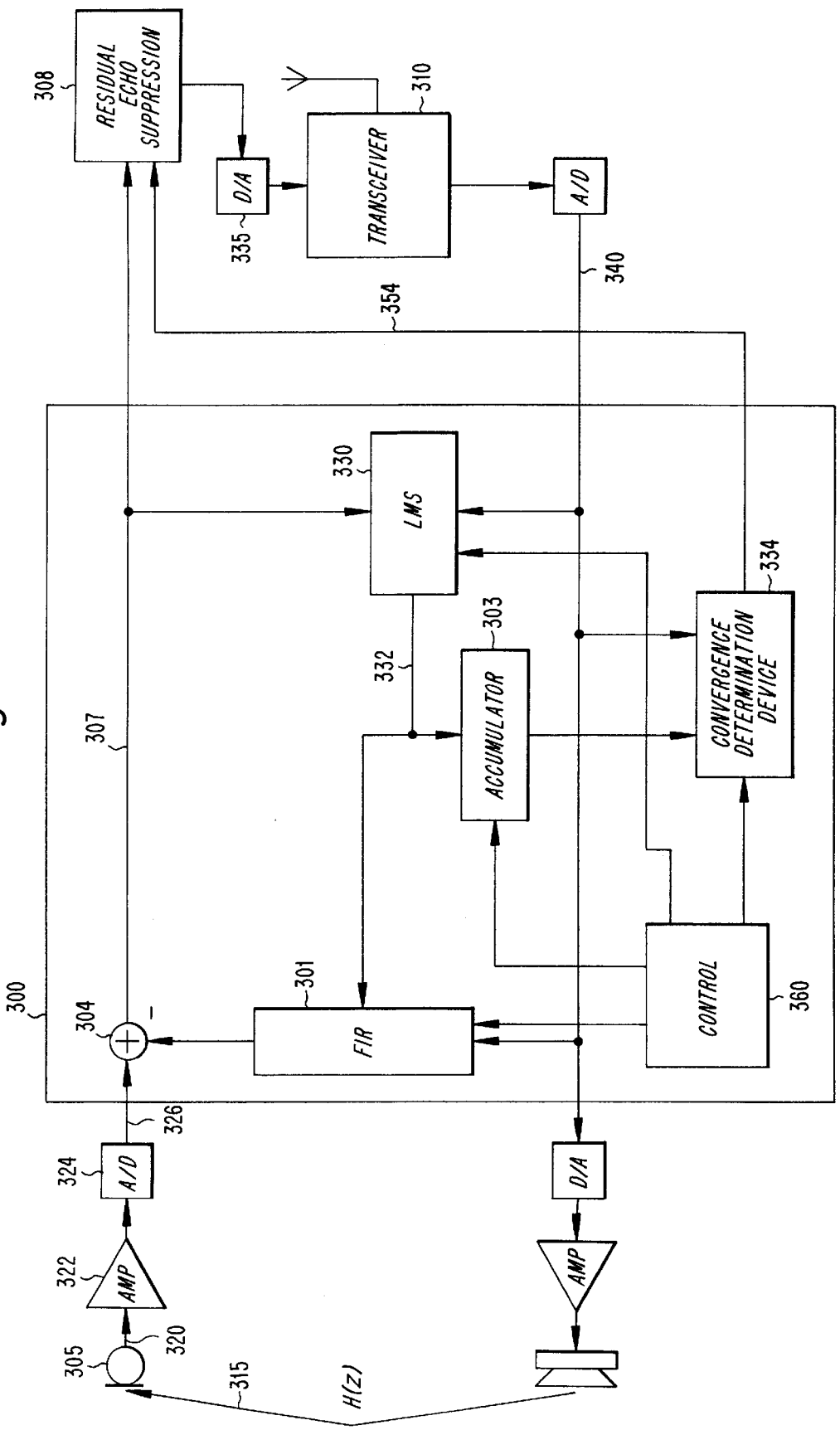
FIG. 3 depicts an echo cancelling system in accordance with a second embodiment of the present invention.

In a second embodiment, depicted in FIG. 3, the invention may operate using a single filter 301, wherein an accumulator 303 is used to accumulate adaptation information during a convergence determination period. The arrangement depicted in FIG. 3 is similar to that of FIG. 2, and operates in a similar fashion. However, it differs in that LMS update information 332 for a given convergence determination period is accumulated in a memory, such as an accumulator 303. In addition, coefficients are accumulated in only one filter 301. When a convergence state is checked, the accumulated information stored in the accumulator 303 is provided to the convergence determination device 334 for appropriate calculations as previously described. The accumulator 303 is then cleared to receive LMS update information for a next period. In this embodiment, the single filter 301 repeatedly receives and accumulates LMS update information 332. The memory 303 may be incorporated within the convergence determining device 334.

The invention has been described with reference to particular embodiments. However, it will be readily apparent to those skilled in the art that it is possible to embody the invention in specific forms other than those of the preferred embodiments described above. For example, the entire filter process may be carried out by an algorithm performed in a general purpose computer or in application specific processing hardware. This may be done without departing from the spirit of the invention.

An exemplary application of the invention has been described in the context of facilitating echo cancellation. However, one skilled in the art will readily appreciate and recognize that a filtering apparatus or method of operation in accordance with the invention can be applied in any scenario wherein determination of the convergence state of a filter arrangement or application may be desirable. Applications normally requiring converged filter arrangements are well suited for application of the present invention. Applications in various disciplines which utilize signal processing also are deemed ripe for application of the present invention.

These include, but are not limited to, signal processing applications in hi-fidelity audio systems, communication systems, testing systems, and control systems.

The preferred embodiments are merely illustrative and should not be considered restrictive in any way. The scope of the invention is given by the appended claims, rather than by the preceding description, and all variations and equivalents which fall within the range of the claims are intended to be embraced therein.

What is claimed is:

1. A convergence gauge for indicating a degree of adaptation of an adaptive filtering apparatus, the convergence gauge comprising:

means for receiving update information for controlling operation of the adaptive filtering apparatus;

means for accumulating the update information for a predetermined period of time; and means for generating, from the accumulated update information, a signal that is indicative of degree of adaptation of the adaptive filtering apparatus.

2. The convergence gauge of claim 1, wherein the update information comprises coefficients for the adaptive filtering apparatus.

3. The convergence gauge of claim 1, wherein the signal generating means comprises means for generating the signal based on a comparison of the accumulated update information with a baseline value.

4. The convergence gauge of claim 3, wherein:

the adaptive filtering apparatus is an adaptive echo cancellation filter; and the baseline value is derived from a signal supplied to the adaptive echo cancellation filter.

5. The convergence gauge of claim 1, wherein the accumulating means is an adaptive filter that contributes to at least part of the filtering operation of the adaptive filtering apparatus.

6. The convergence gauge of claim 1, wherein the accumulating means comprises:

a memory device; and means for adding the update information to a value stored in the memory device.

7. The convergence gauge of claim 1, further comprising means for resetting the accumulating means after the predetermined period of time.

8. The convergence gauge of claim 7, wherein:

the adaptive filtering apparatus comprises a first adaptive filter and a second adaptive filter, each contributing to at least part of the filtering operation of the adaptive filtering apparatus;

the accumulating means is the second adaptive filter;

the update information comprises coefficients for the second adaptive filter; and the convergence gauge further comprises means for transferring the accumulated coefficients from the second adaptive filter to the first adaptive filter.

9. A method for indicating a degree of adaptation of an adaptive filtering apparatus, the method comprising:

receiving update information for controlling operation of the adaptive filtering apparatus;

accumulating the update information for a predetermined period of time; and generating, from the accumulated update information, a first signal that is indicative of degree of adaptation of the adaptive filtering apparatus.

10. The method of claim 9, wherein the update information comprises coefficients for the adaptive filtering apparatus.

11. The method of claim 9, wherein generating the first signal includes a comparison of the accumulated update information with a baseline value.

12. The method of claim 11, wherein the baseline value is derived from a second signal supplied to the adaptive filtering apparatus.

13. The method of claim 9, wherein the step of accumulating comprises using a first adaptive filter to perform at least part of the filtering operation of the adaptive filtering apparatus.

14. The method of claim 13, wherein the method further comprises the steps of:

providing a second adaptive filter; and transferring coefficients from the first adaptive filter to the second adaptive filter after the predetermined period of time.

15. The method of claim 9, wherein the step of accumulating comprises storing accumulated update information in a memory device.

16. The method of claim 9, further comprising the step of:

resetting the update information after the predetermined period of time.

17. The method of claim 9, further comprising the step of using the first signal to control processing of a second signal.

18. A method for processing a system signal in an adaptive filter arrangement having at least one filter and an adaptation mechanism for updating coefficients of the filter, the method comprising the steps of:

accumulating a first sum that is a value of updates provided to the filter coefficients over a predetermined period of time;

accumulating a second sum that is a value of system input signals for the predetermined period of time; and comparing the first sum with the second sum to generate a convergence value signal indicating a degree of convergence in the adaptive filter arrangement.

19. The method claimed in claim 18, further comprising the step of:

using the convergence value signal to control an amount of signal processing on the system signal.

20. The method claimed in claim 19, wherein the step of using the convergence value signal to control an amount of signal processing includes withdrawing signal processing.

21. The method claimed in claim 18, wherein the adaptive filter arrangement further includes a second filter and wherein the method further comprises the step of adding coefficients of the at least one filter to the second filter after the predetermined period of time.

22. The method claimed in claim 21, further comprising the step of:

resetting the coefficients of the at least one filter after the predetermined period of time.

23. A method for invoking echo signal processing on a first signal received by an adaptive filter arrangement, the adaptive filter arrangement including a filter, an adaptation mechanism, and a convergence determination device, the method comprising the steps of:

accumulating a first sum of adaptive update values that have, been supplied to the filter for a predetermined period of time;

accumulating a second sum of second signal values that have been supplied to the adaptive filter arrangement for the predetermined period of time;

assessing convergence of the adaptive filter arrangement by comparing the first sum with the second sum;

invoking signal processing on the first signal if the convergence assessment indicates that the adaptive filter arrangement has not converged beyond a predefined amount.

24. An adaptive filter apparatus for filtering an output signal from a system and for supplying a convergence signal that indicates a degree of filter convergence, the apparatus comprising:

a filter having coefficients;

means for providing adaptive updates to the filter coefficients; and means for accumulating a value indicative of an amount of adaptation; and a convergence determination device, wherein the accumulating means, during a predetermined period of time, accumulates both a first sum representing a value of adaptive updates and a second sum representing a value of signals input to the system, and compares the first and second sums to provide a convergence signal that indicates the degree of convergence of the filter apparatus.

25. An adaptive filter apparatus for monitoring signals received from a first system and output to a second system, and for monitoring and modifying signals output from the second system for output to the first system, which apparatus includes means for processing the signal output from the second system, the filter apparatus comprising:

a filter for generating a correction signal based on the signal received from the first system and a coefficient update signal, which correction signal is added to the signal output from the second system for output to the second system;

an adaptation device for generating the coefficient update signal based on the input signal received from the first system and the correction signal;

means for accumulating a first sum of signals received from the adaptation process over a predetermined period of time;

means for accumulating a second sum of input signals from the first system for the predetermined period of time;

means for comparing the first and second sums; and means for providing signal processing on the signal output to the first system, which signal processing is provided based on the comparison.

26. An adaptive filter apparatus as claimed in claim 25, wherein the comparing means divides the first sum by the second sum.

27. An adaptive filter apparatus comprising:

a first filter;

a second filter connected to the first filter;

an adaptation device connected to the second filter; and a convergence determination device connected to the second filter and to the adaptation device, wherein coefficients of the second filter are periodically updated by the adaptation device;

coefficients of the first filter are periodically updated by the second filter; and the convergence determination device periodically determines the state of convergence by comparing an accumulated value of coefficient updates made to the second filter for a predetermined period of time with a normalizing value for the same period.

* * * * *